United States Patent
Nitta et al.

(10) Patent No.: US 9,354,440 B2
(45) Date of Patent: May 31, 2016

(54) DISPLAY DEVICE AND METHOD FOR MANUFACTURING THE DISPLAY DEVICE

(71) Applicant: Pixtronix, Inc., San Diego, CA (US)

(72) Inventors: Hidekazu Nitta, Chiba (JP); Masataka Okamoto, Chonan-machi (JP)

(73) Assignee: Pixtronix, Inc., San Diego, CA (US)

( * ) Notice: Subject to any disclaimer, the term of this patent is extended or adjusted under 35 U.S.C. 154(b) by 397 days.

(21) Appl. No.: 13/721,240

(22) Filed: Dec. 20, 2012

(65) Prior Publication Data

US 2013/0155481 A1     Jun. 20, 2013

(30) Foreign Application Priority Data

Dec. 20, 2011   (JP) .................................. 2011-278731

(51) Int. Cl.
*G02B 26/02*     (2006.01)
*H01L 21/56*     (2006.01)

(52) U.S. Cl.
CPC .............. *G02B 26/02* (2013.01); *G02B 26/023* (2013.01); *H01L 21/56* (2013.01); *H01L 2924/0002* (2013.01)

(58) Field of Classification Search
CPC ......... G02B 26/00; G02B 26/023; G09G 3/34
USPC .................................................. 359/227, 230
See application file for complete search history.

(56) References Cited

U.S. PATENT DOCUMENTS

| | | | |
|---|---|---|---|
| 2006/0250325 A1 | 11/2006 | Hagood et al. | |
| 2011/0230937 A1* | 9/2011 | Boutaud et al. | ................. 607/62 |
| 2011/0235147 A1* | 9/2011 | Lee et al. | ...................... 359/230 |
| 2012/0248467 A1* | 10/2012 | Yokoyama | .......... H01L 27/3246 |
| | | | 257/88 |

FOREIGN PATENT DOCUMENTS

| | | |
|---|---|---|
| JP | 2007303890 A | 11/2007 |
| JP | 2008522207 A | 6/2008 |
| JP | 2008-197668 | 8/2008 |
| JP | 2011209689 A | 10/2011 |
| WO | WO 2006/091738 A1 | 8/2006 |
| WO | 2008091339 A2 | 7/2008 |

* cited by examiner

*Primary Examiner* — Bumsuk Won
*Assistant Examiner* — William R Alexander
(74) *Attorney, Agent, or Firm* — Edward A. Gordon; Foley & Lardner LLP (57) ABSTRACT

A display device and a method for manufacturing the same, for discharging static electricity generated in the manufacturing process of a display device using a mechanical shutter and thus preventing the mechanical shutter from being deformed by the static electricity are provided. The display device includes a TFT substrate having thin film transistors thereon respectively provided with a plurality of mechanical shutters located in a matrix and also having terminals thereon for supplying a signal to the thin film transistors from outside; and a counter substrate joined with the TFT substrate. Along at least one of an edge of the TFT substrate and an edge of the counter substrate, an injection opening for injecting an insulating liquid into an area between the TFT substrate and the counter substrate and a ground electrode for covering at least a part of an inner surface of the injection opening are provided.

7 Claims, 10 Drawing Sheets

DISPLAY DEVICE AND METHOD FOR MANUFACTURING THE DISPLAY DEVICE

CROSS-REFERENCE TO RELATED APPLICATIONS

This application is based upon and claims the benefit of priority from the prior Japanese Patent Application No. 2011-278731, filed on 20 Dec. 2011, the entire contents of which are incorporated herein by reference.

FIELD

The present invention relates to a display device and a method for manufacturing the same, and specifically to a display device using a mechanical shutter and a method for manufacturing the same.

BACKGROUND

Recently, a display device using a mechanical shutter to which a MEMS (Micro Electro Mechanical Systems) technology is applied (hereinafter, such a shutter will be referred to as a "MEMS shutter") is a target of attention. A display device using a MEMS shutter (hereinafter, referred to as a "MEMS display device") opens or closes a MEMS shutter provided in correspondence with each of pixels, at a high speed by use of a thin film transistor (TFT), to control the amount of light to be transmitted through the shutter, and thus adjusts the brightness of an image (see, for example, Japanese Laid-Open Patent Publication No. 2008-197668). A mainstream gray scale system of such MEMS display devices is a time-ratio gray scale system of displaying an image by sequentially switching light provided from one of red, green and blue LEDs of an LED backlight unit to light provided from another LED of the LED backlight unit. Accordingly, the MEMS display devices have features that polarizing films or color filters used for a display device are not required; and as compared with a display device, the utilization factor of backlight is about 10 times higher, the power consumption is no more than half, and the color reproducibility is superior.

A MEMS display device is formed as follows. A TFT including switching elements for driving MEMS shutters, and gate and data drivers for driving the switching elements is formed on a substrate. Terminals for supplying signals from an external device to the TFT are also formed on the substrate. Usually for forming a MEMS display device, on the TFT substrate having the TFTs and the terminals formed thereon, a passivation film (insulating film) for covering the TFTs and the terminals is formed, and MEMS shutters are formed on the passivation film. An insulating film is formed to cover the MEMS shutters except for a part of each MEMS shutter which is to be electrically connected to a terminal. A movable section of the MEMS shutter has a hollow structure. Therefore, the insulating film is formed by CVD (Chemical Vapor Deposition) or the like on the entirety of a surface of the TFT substrate having the MEMS shutters formed thereon, so that a side surface and a bottom surface of the movable section is covered with the insulating film. Then, a counter substrate is joined to the TFT substrate. The terminals formed on the TFT substrate need to be supplied with signals from an external device. Therefore, the TFT substrate and the counter substrate are joined together such that the counter substrate does not cover a top surface of each terminal.

Figure 10:
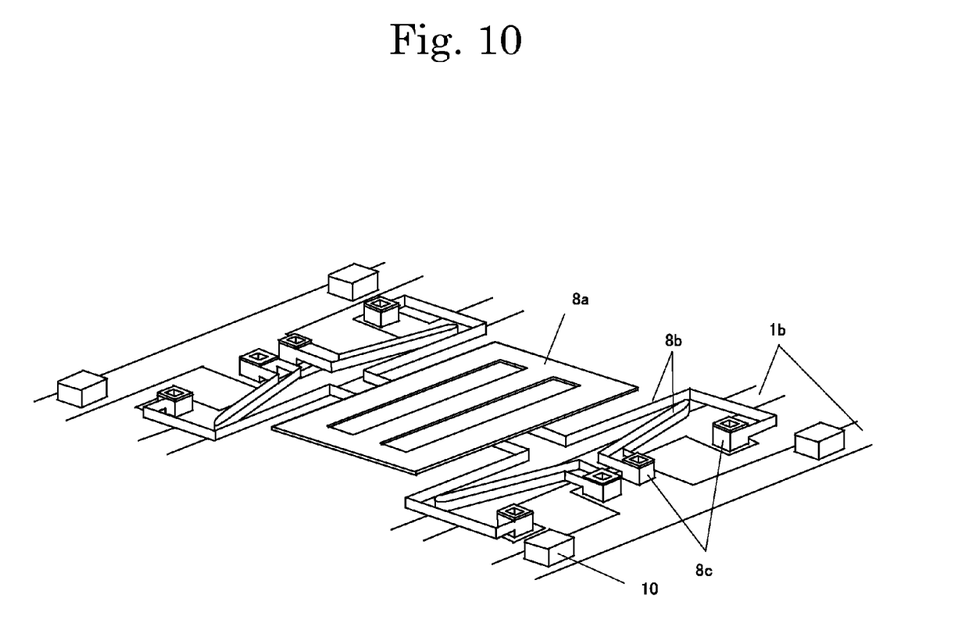
FIG. 10 is an isometric view showing a schematic structure of a conventional TFT substrate using a MEMS shutter.

FIG. 10 is a schematic view of a pixel of a conventional MEMS display device. Elements of a display panel including a MEMS shutter on a TFT substrate adheres to the substrate or is deformed by static electricity. A spring structure formed of springs 8b connected to move the MEMS shutter is expanded or contracted by an electrical signal and thus moves a blocking section 8a of the MEMS shutter. A manufacturing process of the panel including a MEMS shutter on a power supply section (or wiring section) 1b of the TFT substrate includes a step of enclosing an insulating liquid such as silicone oil or the like to an area between the substrate having the MEMS shutter thereon and a counter substrate having a window. This step is carried out for the purpose of preventing the springs 8b connected to move the MEMS shutter from adhering to the TFT substrate having the MEMS shutter thereon or to the counter substrate having the window.

However, at the time of enclosure of the insulating liquid, static electricity is generated by friction of the liquid. Therefore, the MEMS shutter cannot be kept at a proper position or cannot be kept in a state of floating in the insulating liquid, and thus adheres to the substrate.

The present invention made in light of the above-described problem has an object of providing a display device and a method for manufacturing the same, for removing static electricity generated by friction at the time of enclosure of the insulating liquid and thus preventing a blocking section and springs of a MEMS shutter from adhering to the substrate or from being deformed.

SUMMARY

An embodiment of the present invention provides a display device comprising a TFT substrate having thin film transistors thereon respectively provided with a plurality of MEMS shutters located in a matrix and also having terminals thereon for supplying a signal to the thin film transistors from outside; and a counter substrate joined with the TFT substrate. Along at least one of an edge of the TFT substrate and an edge of the counter substrate, an injection opening for injecting an insulating liquid into an area between the TFT substrate and the counter substrate and a ground electrode for covering at least a part of an inner surface of the injection opening are provided.

An embodiment of the present invention provides a method for manufacturing a display device, comprising forming, on a TFT substrate, thin film transistor and terminals for supplying a signal to the thin film transistors from outside; forming, on the TFT substrate having the thin film transistors and the terminals formed thereon, a passivation film for covering the thin film transistors and the terminals; forming, on the passivation film, a plurality of MEMS shutters located in a matrix and provided respectively in correspondence with the thin film transistors; joining together the counter substrate to the TFT substrate; and forming a ground electrode for covering at least a part of an injection opening for injecting an insulating liquid into an area between the TFT substrate and a counter substrate, the ground electrode being formed along at least one of an edge of the TFT substrate and an edge of the counter substrate.

BRIEF DESCRIPTION OF DRAWINGS

FIG. 1(A) is a front view of the display device 100 showing the interior thereof, and FIG. 1(B) is a cross-sectional view taken along line B-B in FIG. 1(A);

FIG. 4(A) is an isometric view of the display device 100, and FIG. 4(B) is a plan view of the display device 100;

FIG. 6(A) is a front view of the display device 100 showing the interior thereof, and FIG. 6(B) is a cross-sectional view taken along line B-B in FIG. 6(A);

FIG. 7(A) is a front view of the display device 100 showing the interior thereof, and FIG. 7(B) is a cross-sectional view taken along line B-B in FIG. 7(A);

FIG. 8(A) is a front view of the display device 100 showing the interior thereof, and FIG. 8(B) is a cross-sectional view taken along line B-B in FIG. 8(A);

DESCRIPTION OF EMBODIMENTS

As described above, a display device according to the present invention has a feature that static electricity, generated in a step of injecting an insulating liquid into an area where a MEMS shutter is to be located, is removed by a ground electrode which is formed at an injection opening for the insulating liquid and at least a part of an inner surface of the injection opening.

The ground electrode needs to have at least a shape and a structure which allow the ground electrode to be conductive to an external ground electrode. In order to improve the function of removing the static electricity, it is preferable that the ground electrode has a shape covering the entirety of an area from the injection opening to an injection path, not only an area in the vicinity of the edge of the injection opening. For example, as shown in FIG. 1 and FIG. 6 through FIG. 8 referred to later, it is preferable that a ground electrode 7 is located on at least a surface of a TFT substrate 1 or a surface of a counter substrate 2 so as to face the counter substrate 2 or the TFT substrate 1, from an area including an injection opening 4 and an injection path 4a along an edge of the TFT substrate 1 and the counter substrate 2.

Figure 3:
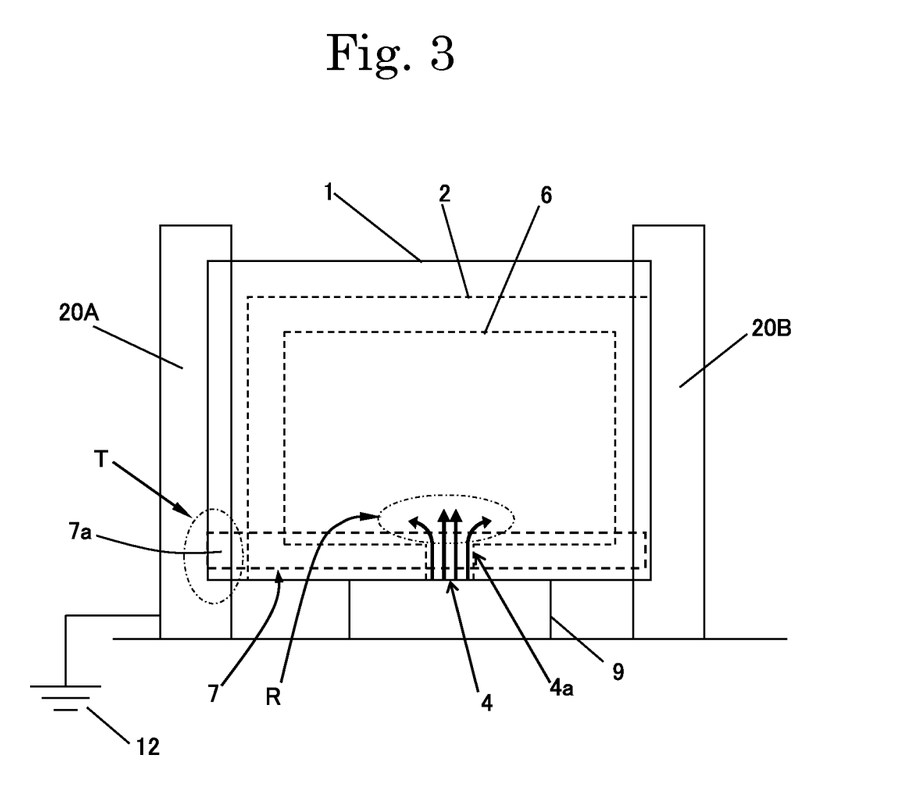
FIG. 3 is a schematic cross-sectional view showing a step of injecting an insulating liquid into the display device 100 according to Embodiment 1 of the present invention.

It is preferable that the ground electrode formed on at least one of the TFT substrate and the counter substrate is structured to have conductivity to a metal part or a ground electrode part which forms a section used in the step of injecting the insulating liquid. For example, as shown in FIG. 3 referred to later, it is preferable that a part of the ground electrode 7 is exposed outside from the area where the TFT substrate 1 and the counter substrate 2 are joined together, so that this part is used as a conductive part 7a. The conductive part 7a is connected to a part of an injection section 9 used for the injection step, or to a part of securing sections (jigs 20A and 20B shown in FIG. 3) for securing the TFT substrate 1 and the counter substrate 2, the part being grounded or being kept at a ground potential.

The ground electrode formed on the TFT substrate and/or the counter substrate may be formed of a metal material such as copper, aluminum or the like, a conductive paste, a carbon nanotube film, an oxide material such as an ITO film or the like, or any other material, as long as the material has conductivity. Preferably, the ground electrode to be formed on the TFT substrate and/or the counter substrate is produced at the same time as an ITO film used for a wiring line in the case where the ground electrode is formed on the TFT substrate, and at the same time as an aluminum film used for a wiring line in the case where the ground electrode is formed on the counter substrate.

Figure 9:
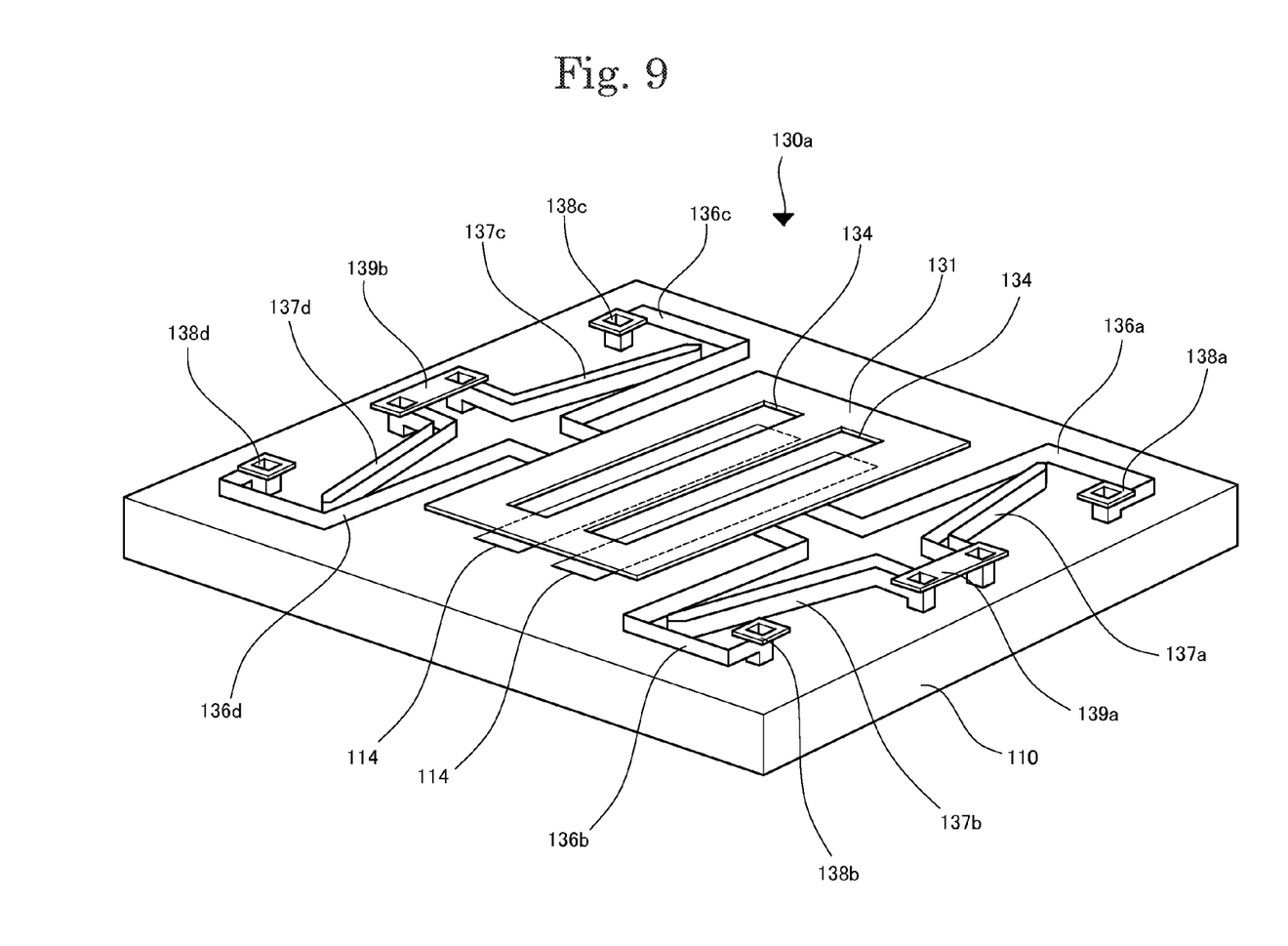
FIG. 9 shows a schematic structure of a MEMS shutter usable for a display device according to the present invention.

Now, with reference to FIG. 9, a structure of the MEMS shutter usable for the present invention will be described. FIG. 9 shows a structure of the MEMS shutter 130a usable for the display device 100 in an embodiment according to the present invention. FIG. 9 shows one MEMS shutter 130a for the convenience of description, but the display device 100 in an embodiment according to the present invention includes a plurality of MEMS shutters 130a shown in FIG. 9 arranged in a matrix on a substrate 110.

The MEMS shutter 130a includes a shutter 131, first springs 136a, 136b, 136c and 136d, second springs 137a, 137b, 137c and 137d, and anchor sections 138a, 138b, 138c, 138d, 139a and 139b. The shutter 131 has openings 134, and a main body of the shutter 131 acts as a light blocking section. Although not shown, a counter substrate 140 (see FIG. 4) has a light-transmissive section for transmitting light. The counter substrate 140 is joined to the substrate 110 via a sealing material or the like such that the openings 134 of the shutter 131 and the light-transmissive section of the counter substrate 140 generally overlap each other in a planar direction. The display device 100 is structured such that light supplied from behind the counter substrate 140 and transmitted through the light-transmissive section of the counter substrate 140 is transmitted through the openings 134 of the shutter 131 and thus is visually recognized by the human eye. The MEMS shutter 130a in this embodiment is merely an example of MEMS shutter usable for the display device 100 according to the present invention. The MEMS shutter usable for a display device according to the present invention is not limited to having the structure shown in FIG. 9, but may be any MEMS shutter which can be driven by a switching element.

One side of the shutter 131 is connected to the anchor sections 138a and 138b via the first springs 136a and 136b. The anchor sections 138a and 138b have a function of supporting the shutter 131 such that shutter 131 floats above a surface of the substrate 110 together with the first springs 136a and 136b. The anchor section 138a is electrically connected to the first spring 136a, and the anchor section 138b is electrically connected to the first spring 136b. The anchor section 138a and 138b are each supplied with a bias potential from a switching element 104 (see FIG. 5) and thus the first springs 136a and 136b are each supplied with the bias potential. The second springs 137a and 137b are electrically connected to the anchor section 139a. The anchor section 139a has a function of supporting the second springs 137a and 137b such that the second springs 137a and 137b float above the surface of the substrate 110. The anchor section 139a is supplied with a ground potential, and thus the second springs 137a and 137b are each supplied with the ground potential. The anchor section 139a may be supplied with a predetermined potential instead of the ground potential. This is also applicable to the following description regarding the ground potential.

The other side of the shutter 131 is connected to the anchor sections 138c and 138d via the first springs 136c and 136d. The anchor sections 138c and 138d have a function of supporting the shutter 131 such that shutter 131 floats above the surface of the substrate 110 together with the first springs 136c and 136d. The anchor section 138c is electrically connected to the first spring 136c, and the anchor section 138d is electrically connected to the first spring 136d. The anchor section 138c and 183d are each supplied with a bias potential from the switching element 104, and thus the first springs 136c and 136d are each supplied with the bias potential. The second springs 137c and 137d are electrically connected to the anchor section 139b. The anchor section 139b has a function of supporting the second springs 137c and 137d such that the second springs 137c and 137d float above the surface of the substrate 110. The anchor section 139b is electrically connected to the second springs 137c and 137d. The anchor section 139b is supplied with a ground potential, and thus the second springs 137c and 137d are each supplied with the ground potential.

As described above, in this embodiment, the anchor sections 138a and 138b are each supplied with a bias potential from the switching element 104, and thus the first springs 136a and 136b are each supplied with the bias potential. Also, the anchor section 139a is supplied with a ground potential, and thus the second springs 137a and 137b are each supplied with the ground potential. By a potential difference of the first springs 136a and 136b from the second springs 137a and 137b, the first spring 136a and the second spring 137a are electrostatically driven and moved to be attracted to each other, and the first spring 136b and the second spring 137b are electrostatically driven and moved to be attracted to each other. Thus, the shutter 131 is moved.

Similarly, the anchor sections 138c and 138d are each supplied with a bias potential from the switching element 104, and thus the first springs 136c and 136d are each supplied with the bias potential. Also, the anchor section 139b is supplied with a ground potential, and thus the second springs 137c and 137d are each supplied with the ground potential. By a potential difference of the first springs 136c and 136d from the second springs 137c and 137d, the first spring 136c and the second spring 137c are electrostatically driven and moved to be attracted to each other, and the first spring 136d and the second spring 137d are electrostatically driven and moved to be attracted to each other. Thus, the shutter 131 is moved.

In this embodiment, the first springs, the second springs and the anchor sections are provided on both sides of the shutter 131, but the display device 100 according to the present invention is not limited to such a structure. For example, the first springs, the second springs and the anchor sections may be provided on one side of the shutter 131, and only the first springs and the anchor sections may be provided on the other side of the shutter 131. The first springs and the anchor sections provided on the other side of the shutter 131 may have a function of supporting the shutter 131 such that the shutter 131 floats above the substrate 110, and the first springs and the second springs on the one side of the shutter 131 may be electrostatically driven to move the shutter 131.

Hereinafter, preferable embodiments of a display device according to the present invention will be described with reference to the drawings. The display device according to the present invention is not limited to the following embodiments, and the present invention can be carried out in various modifications.

Embodiment 1

Figure 1:
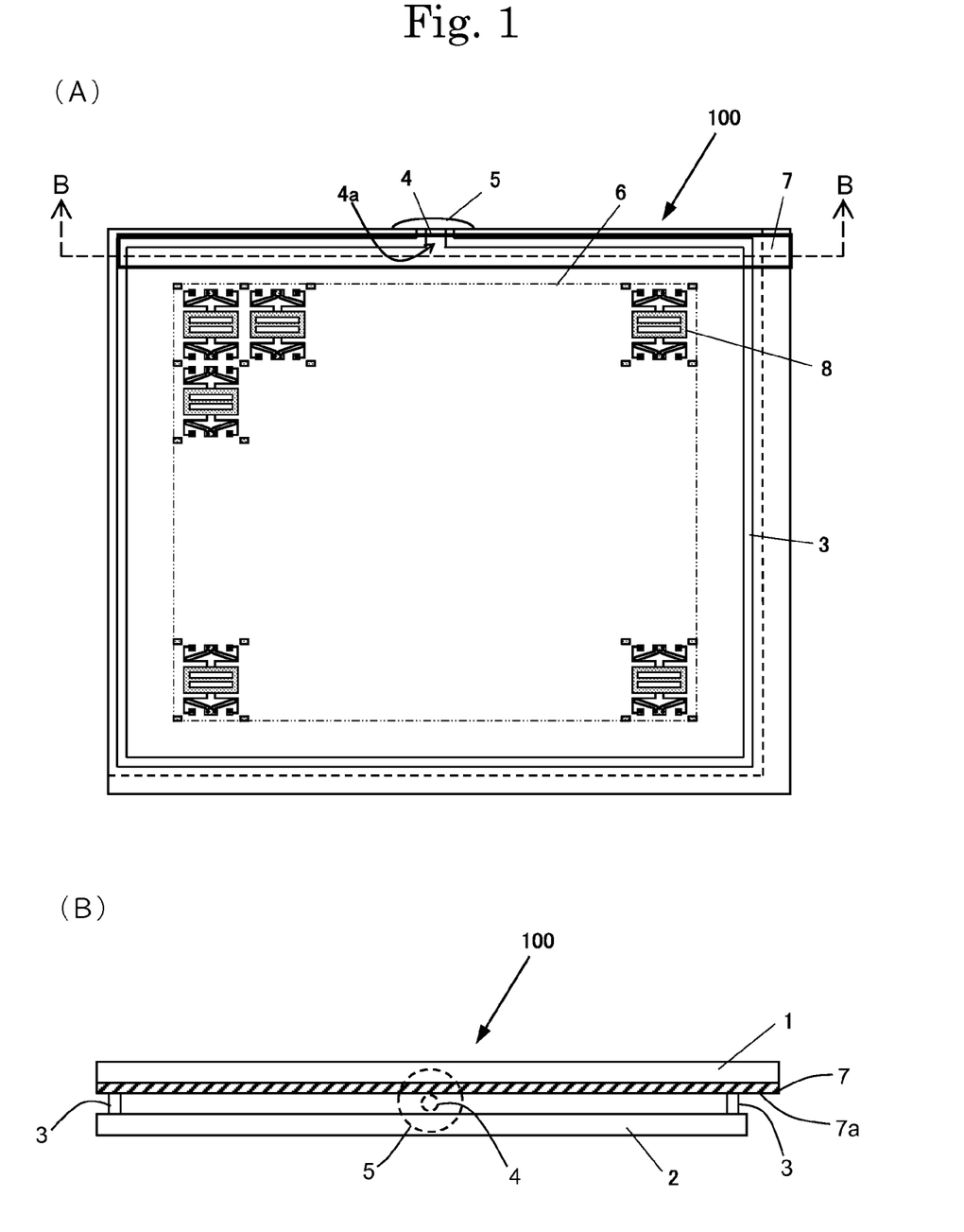
FIG. 1 shows a display device 100 according to Embodiment 1 of the present invention.

FIG. 1 shows a display device 100 according to Embodiment 1 of the present invention. FIG. 1(A) is a front view of the display device 100 showing the interior thereof, and FIG. 1(B) is a cross-sectional view taken along line B-B in FIG. 1(A). As shown in FIG. 1, the TFT substrate 1 has a pixel area 6 thereon. A MEMS shutter 8 is provided for each of pixels included in the pixel area 6, and thus a plurality of MEMS shutters 8 are located in a matrix. On the rear side of the TFT substrate 1, a LED backlight unit including red, green and blue LEDs (not shown) is provided.

Figure 2:
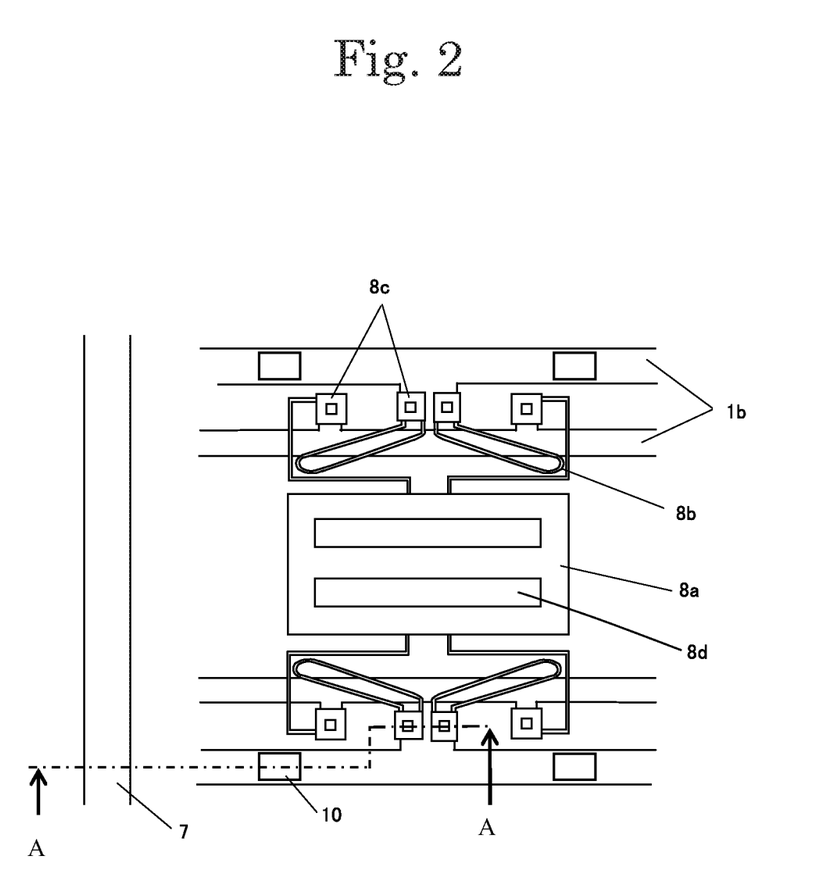
FIG. 2 shows a schematic structure of a pixel and a MEMS shutter of the display device 100 according to Embodiment 1 of the present invention.

FIG. 2 is an enlarged view showing a structure of one pixel on the TFT substrate 1. The MEMS shutter 8 provided for each pixel includes a hollow blocking section 8a for blocking light from the LED backlight unit, and springs 8b secured to a wiring section (power supply section) 1b of the TFT substrate 1. The springs 8b of the MEMS shutter are secured to the wiring section 1b via anchoring sections 8c, and the spring structure formed of the springs 8b is expanded and contracted by an electrical signal supplied from the wiring section 1b. The expansion and contraction operation of the springs 8b sequentially switches the color of light transmitted through slits 8d of the blocking section 8a, and thus an image is displayed on the display device. As represented by A-A line, the springs 8b of each MEMS shutter are guaranteed as being conductive with the electrode 7 via the wiring section 1b and the anchoring sections 8c.

At the time when the TFT substrate 1 and the counter substrate 2 are joined together, an area to be filled with an insulating liquid such as silicone oil or the like is formed in the pixel area 6 between the substrates 1 and 2. Reference sign 10 in FIG. 2 represents a support for providing a clearance with certainty between the TFT substrate 1 and the counter substrate 2. The clearance is required to form the area to be filled with an insulating liquid at the time when the TFT substrate 1 and the counter substrate 2 are joined together. Between the TFT substrate 1 and the counter substrate 2, a sealing member 3 is sandwiched for preventing the injected insulating liquid from leaking.

At least one of the TFT substrate 1 and the counter substrate 2 has an injection opening 4 for injecting the insulating liquid. In at least a partial area of the injection opening 4, an electrode conductive with an external electrode is formed.

As shown in FIG. 3, in the state where the TFT substrate 1 and the counter substrate 2 are joined together and left and right edges thereof are held by jigs 20A and 20B, the insulating liquid is injected through the injection opening 4 after passing the injection section 9. As represented by reference sign R, the insulating liquid flows into the pixel area 6. The flow R of the insulating liquid contacts the injection opening 4, the injection path 4a, the MEMS shutter 8, the TFT substrate 1 and the like, and thus generates static electricity.

In the display device according to this embodiment, the electrode 7 having a predetermined width is formed along an area where the TFT substrate 1 and the counter substrate 2 are joined together, namely, an area where the pixel area 6 is not formed. More specifically, the electrode 7 is formed along an edge of such an area, which is the edge at which the injection opening 4 and the injection path 4a are formed; and extends to the left and to the right from the area where the injection opening 4 and the injection path 4a are formed. A part of the electrode 7 is exposed outside beyond the area where the TFT substrate 1 and the counter substrate 2 are joined together. The exposed part acts as the conductive part 7a. In the step of injecting the insulating liquid, the conductive part 7a is kept at a ground potential via a contact part T thereof contacting the jig 20A. Therefore, the static electricity flows from the jig 20A to a ground section 12 via the conductive part 7a. Thus, even in the step of injecting the insulating liquid, the MEMS shutter 8 in the pixel area 6 can be prevented from adhering to the TFT substrate 1 or the counter substrate 2.

After the pixel area 6 is filled with the insulating liquid sufficiently, the injection opening 4 is closed by use of an end seal 5, and thus the injection step is finished. The electrode 7 shown in FIG. 3 includes the exposed conductive part 7a only at one of two ends thereof, and is not exposed at the end close to the jig 20B. Alternatively, the electrode 7 may have a length with which the electrode 7 can also contact the jig 20B.

FIG. 4(A) and FIG. 4(B) show a detailed structure of the display device 100 according to Embodiment 1. FIG. 4(A) is an isometric view of the display device 100, and FIG. 4(B) is a plan view thereof. The display device 100 in this embodiment includes a substrate 110 and a counter substrate 140. The substrate 110 includes a display section 101a, driving circuits 101b, 101c and 101d, and a terminal section 101e. The substrate 110 and the counter substrate 140 are joined together by use of a sealing material or the like.

Figure 5:
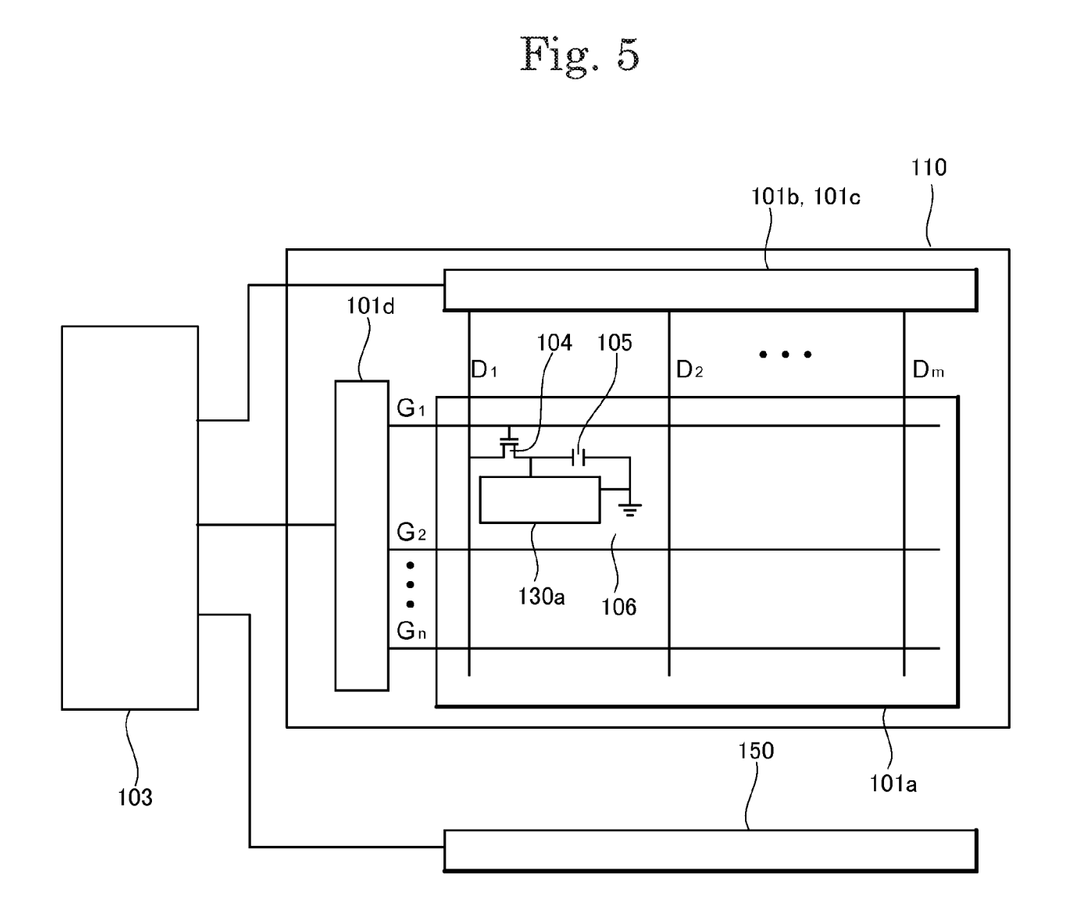
FIG. 5 is a circuit block diagram of the display device 100 according to Embodiment 1 of the present invention.

FIG. 5 is a circuit block diagram of the display device 100 in Embodiment 1. The display device 100 in Embodiment 1 according to the present invention shown in FIG. 5 is supplied with an image signal and a control signal from a controller 103. The display device 100 in Embodiment 1 according to the present invention shown in FIG. 5 is also supplied with light from a backlight unit 150 controlled by the controller 103. The display device 100 according to the present invention may be structured to include the controller 103 and the backlight unit 150.

Figure 4:
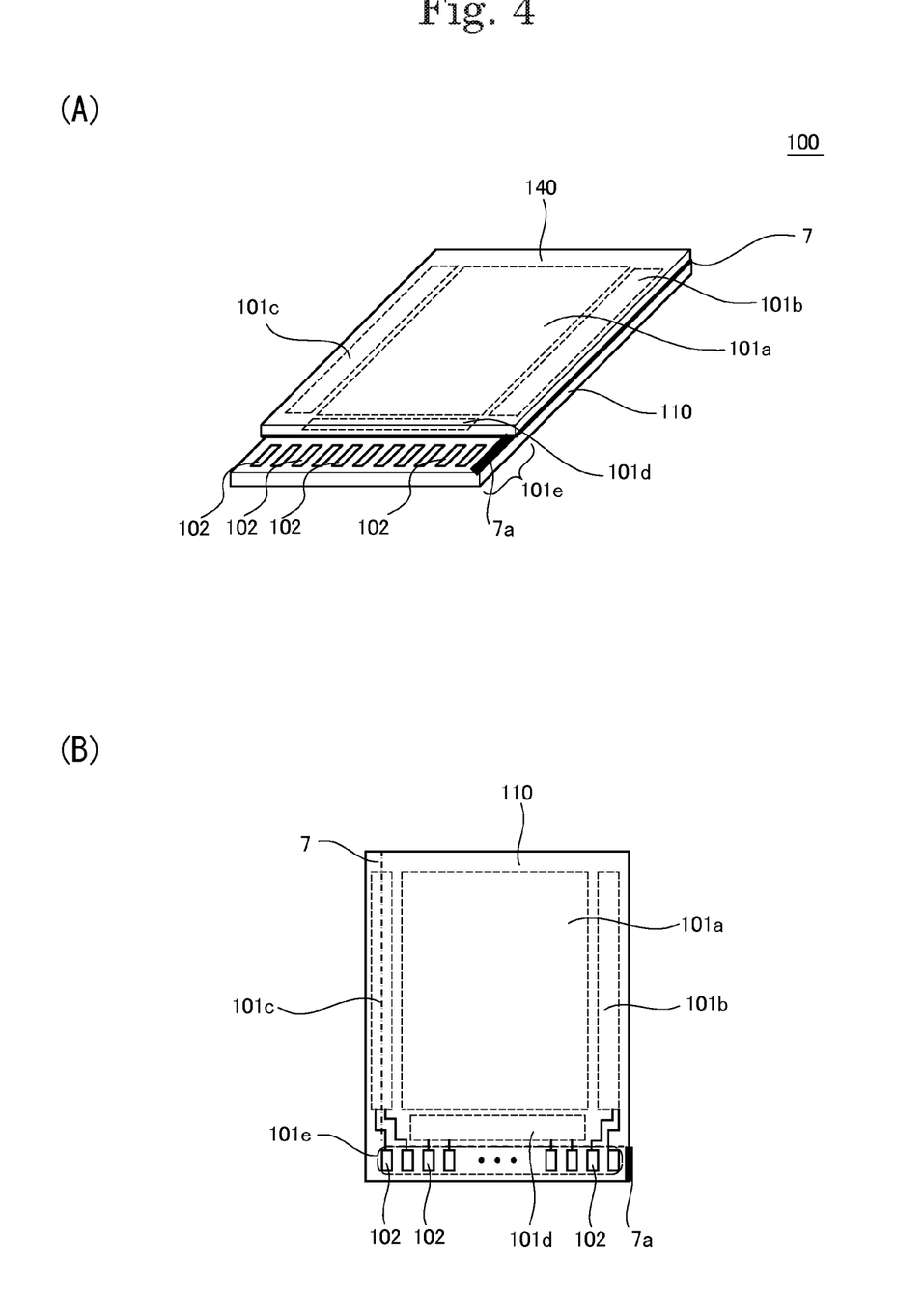
FIG. 4 shows the display device 100 according to Embodiment 1 of the present invention.

As shown in FIG. 5, the display section 101a includes a plurality of pixels 106 arranged in a matrix and respectively provided in correspondence with intersections of gate lines (G1, G2, . . . , Gn) and data lines (D1, D2, . . . , Dm). Each of the pixels 106 includes a mechanical shutter (MEMS shutter) 130a, a switching element 104, and a storage capacitance 105. The driving circuits 101b and 101c are data drivers, and supply data signals to the switching elements 104 via the data lines (D1, D2, . . . , Dm). The driving circuit 101d is a gate driver and supplies gate signals to the switching elements 104 via the gate lines (G1, G2, . . . , Gn). In this embodiment, as shown in FIG. 4, the driving circuits 101b and 101c as the data drivers are provided to have the display section 101a therebetween, but the arrangement of the driving circuits 101b and 101c is not limited to this. Each switching element 104 drives the corresponding MEMS shutter 130a based on the data signal supplied from the corresponding data line among the data lines (D1, D2, . . . , Dm).

Embodiment 2

Figure 6:
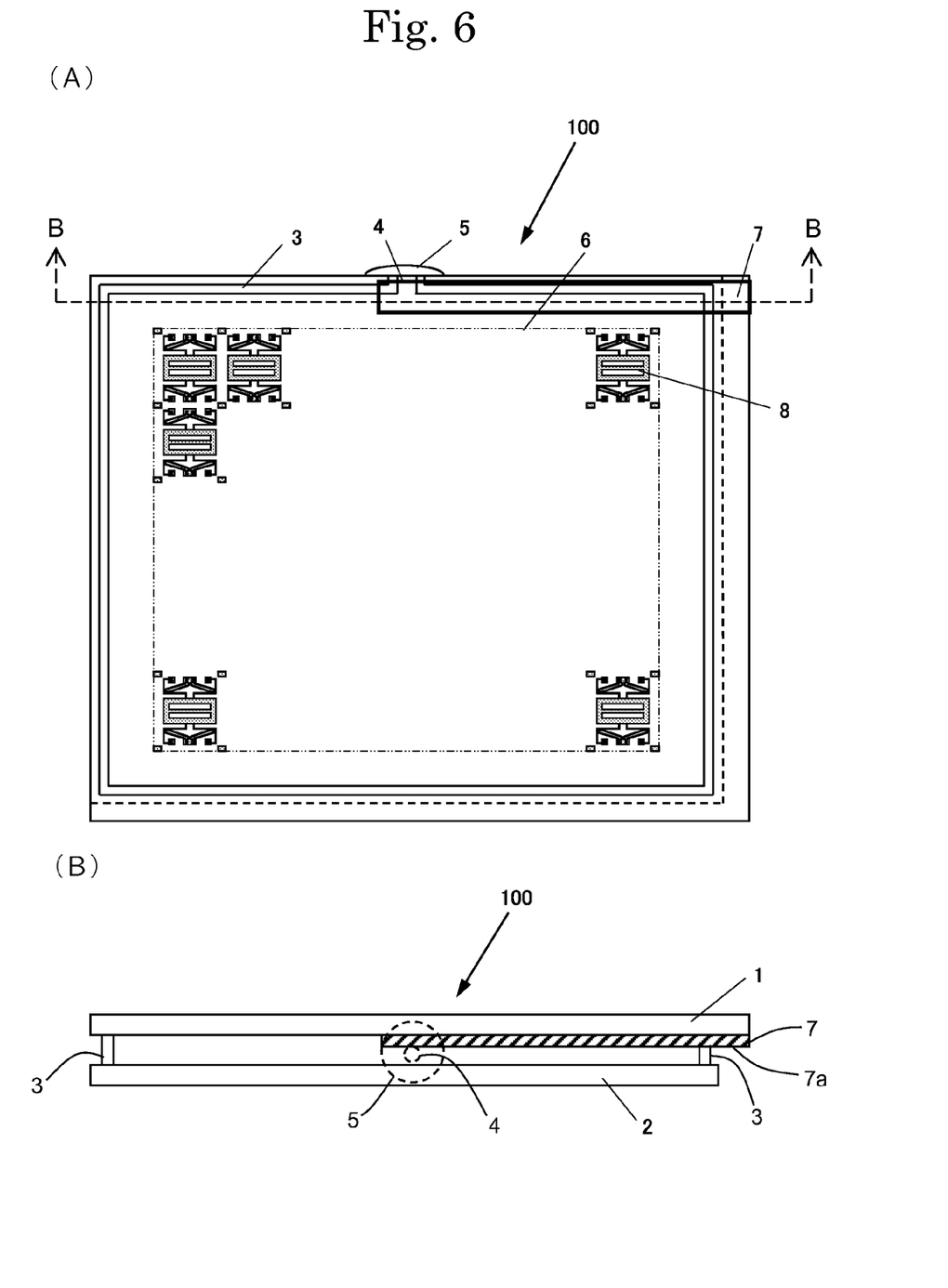
FIG. 6 shows a display device 100 according to Embodiment 2 of the present invention.

FIG. 6 shows a display device 100 according to Embodiment 2 of the present invention. FIG. 6(A) is a front view of the display device 100 showing the interior thereof, and FIG. 6(B) is a cross-sectional view taken along line B-B in FIG. 6(A).

This embodiment is different from Embodiment 1 on the structure of the electrode 7. Specifically, the electrode 7 in Embodiment 1 is formed to extend to the left and to the right from the area where the injection opening 4 and the injection path 4a are formed. Meanwhile, the electrode 7 in Embodiment 2 extends in one direction from the area where the injection opening 4 and the injection path 4a are formed.

The electrode 7 in this embodiment is shorter than the electrode 7 in Embodiment 1, but such a structure can sufficiently exert a function of removing static electricity generated in the injection step. In addition, since the electrode 7 is shorter, the production yield of the display device 100 can be improved.

Embodiment 3

Figure 7:
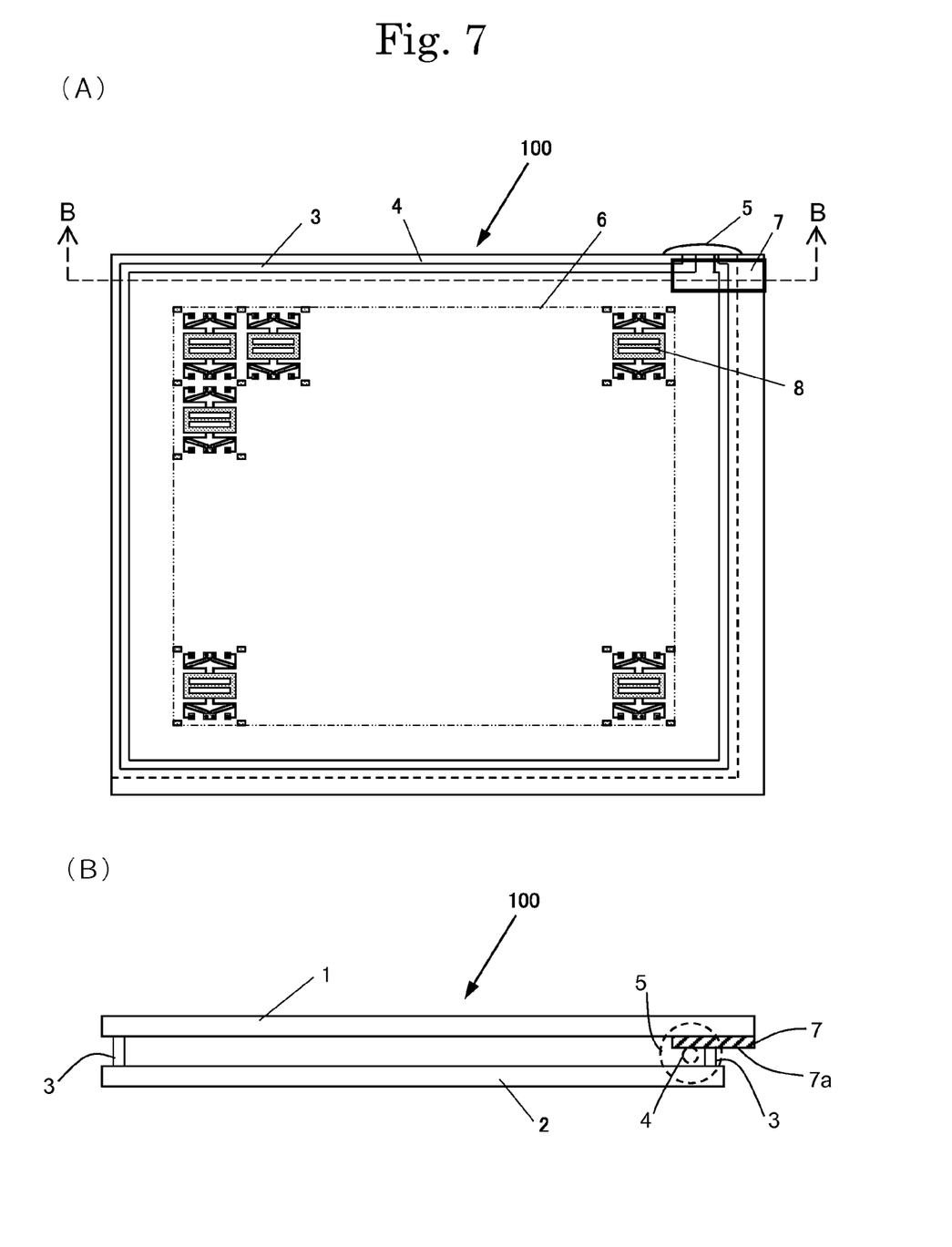
FIG. 7 shows a display device 100 according to Embodiment 3 of the present invention.

FIG. 7 shows a display device 100 according to Embodiment 3 of the present invention. FIG. 7(A) is a front view of the display device 100 showing the interior thereof, and FIG. 7(B) is a cross-sectional view taken along line B-B in FIG. 7(A).

This embodiment is different from Embodiment 1 and also Embodiment 2 on the structure of the electrode 7. Specifically, the injection opening 4 and the electrode 7 are formed only in the vicinity of one end among two ends of the TFT substrate 1 and the counter substrate 2 held by the jigs 20A and 20B.

This embodiment is preferably applicable for changing the position of the injection opening 4 when the structure of the display device is changed. The electrode 7 in this embodiment is shorter than the electrode 7 in Embodiment 1 and also the electrode in Embodiment 2, but such a structure can sufficiently exert a function of removing static electricity generated in the injection step. In addition, since the electrode 7 is shorter, the production yield of the display device 100 can be improved.

Embodiment 4

Figure 8:
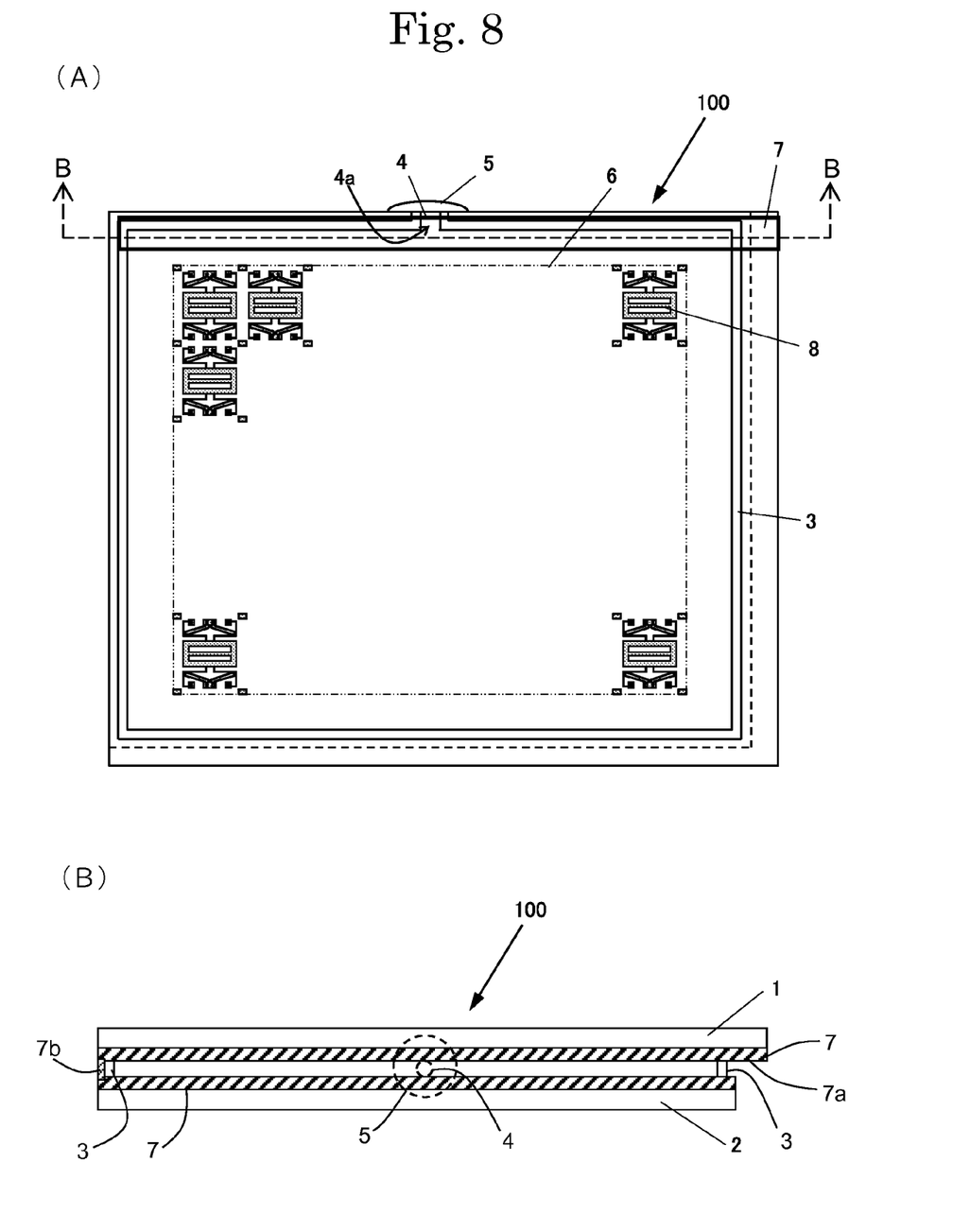
FIG. 8 shows a display device 100 according to Embodiment 4 of the present invention.

FIG. 8 shows a display device 100 according to Embodiment 4 of the present invention. FIG. 8(A) is a front view of the display device 100 showing the interior thereof, and FIG. 8(B) is a cross-sectional view taken along line B-B in FIG. 8(A).

In this embodiment, the electrode 7 is formed on the TFT substrate 1 and also on the counter substrate 2 joined with the TFT substrate 1, such that the electrodes 7 face each other. The electrode 7 facing each other are electrically connected to each other via a solder bump 7b. Alternatively, the two electrodes 7 facing each other may be connected to each other via a metal wiring line formed of copper (Cu), aluminum (Al) or the like instead of the solder bump.

In this embodiment, the electrodes 7 are provided both on the TFT substrate 1 and the counter substrate 2. Such a structure has a splendid function of discharging static electricity outside, and provides a superior effect of removing static electricity generated by friction at the time of enclosure of the insulating injection.

A display device and a method for manufacturing the same according to the present invention can effectively remove static electricity from generated by friction at the time of enclosure of the insulating liquid, although by a simple method, and thus can effectively prevent the MEMS shutter from adhering to the substrate or from being deformed.

According to a display device and a method for manufacturing the same of the present invention, the static electricity generated at the time of enclosure of the insulating liquid, and also the static electricity already generated, can be removed. Thus, the MEMS shutter can be returned to a proper position.

The invention made by the present inventor has been described by way of embodiments. The present invention is not limited to the above-described embodiments and may be modified variously without departing from the gist of the invention, needless to say.

What is claimed is:

1. A display device, comprising:
   a first substrate having thin film transistors thereon respectively provided with a plurality of mechanical shutters located in a matrix;
   a counter substrate joined with the first substrate via a sealing member, wherein the sealing member includes, along at least one of an edge of the first substrate and a corresponding edge of the counter substrate, an injection opening for injecting an insulating liquid into an area between the first substrate and the counter substrate;
   terminals disposed on the first substrate for supplying a signal to the thin film transistors from outside the sealing member; and
   a ground electrode covering at least a part of an inner surface of the injection opening.

2. A display device according to claim 1, wherein the ground electrode is located to be conductive to an external ground electrode.

3. A display device according to claim 1, wherein:
   the ground electrode is connectable to an injection section for injecting the insulating liquid to the area between the first substrate and the counter substrate or to a securing section for securing the first substrate and the counter substrate; and
   a connection part for connecting the ground electrode and the injection section or the securing section is kept at a ground potential.

4. A method for manufacturing a display device, comprising:
   forming, on a first substrate, thin film transistors and terminals for supplying a signal to the thin film transistors from outside a sealing member coupling the first substrate to a counter substrate;
   forming, on the first substrate having the thin film transistors and the terminals formed thereon, a passivation film for covering the thin film transistors and the terminals;
   forming, on the passivation film, a plurality of mechanical shutters located in a matrix and provided respectively in correspondence with the thin film transistors;
   forming a ground electrode for covering at least a part of an injection opening in the sealing member for injecting an insulating liquid into an area between the TFT substrate and the counter substrate, the ground electrode being formed along at least one of an edge of the first substrate and an edge of the counter substrate; and
   joining together the counter substrate to the first substrate with the sealing member.

5. A method for manufacturing a display device according to claim 4, wherein the ground electrode is located to be conductive to an external ground electrode.

6. A method for manufacturing a display device according to claim 4, wherein:
   the ground electrode is connectable to an injection section for injecting the insulating liquid to the area between the first substrate and the counter substrate or to a securing section for securing the first substrate and the counter substrate; and
   a connection part for connecting the ground electrode and the injection section or the securing section is kept at a ground potential.

7. A method for manufacturing a display device according to claim 4, wherein the ground electrode is formed in an area including the injection opening when wiring of the first substrate and the counter substrate are formed.

* * * * *